United States Patent [19]

Takatsu

[11] Patent Number: 5,153,461
[45] Date of Patent: Oct. 6, 1992

[54] LOGIC CIRCUIT USING ELEMENT HAVING NEGATIVE DIFFERENTIAL CONDUCTANCE

[75] Inventor: Motomu Takatsu, Hadano, Japan

[73] Assignee: Fujitsu Ltd., Kanagawa, Japan

[21] Appl. No.: 620,033

[22] Filed: Nov. 30, 1990

[30] Foreign Application Priority Data

Nov. 30, 1989 [JP] Japan .................. 1-311602

[51] Int. Cl.⁵ .................... H03K 19/23; H03K 19/00
[52] U.S. Cl. .................... 307/464; 307/478
[58] Field of Search ................. 307/478, 464

[56] References Cited

U.S. PATENT DOCUMENTS

| | | | |
|---|---|---|---|
| 3,156,816 | 11/1964 | Kosonocky et al. | 307/478 |
| 3,260,841 | 7/1966 | Hayden | 307/478 |
| 3,290,517 | 12/1966 | Akmenkalns | 307/478 |
| 3,631,260 | 12/1971 | Yoshino | 307/464 |

FOREIGN PATENT DOCUMENTS 130561 6/1987 Japan .

OTHER PUBLICATIONS

M. Suzuki et al., "Gate Arrays", 1988 IEEE International Solid-State Circuits Conference, ISSCC 88, Wednesday, Feb. 17, 1988, pp. 70-71.
N. Yokoyama et al., "A New Functional, Resonant-Tunnelling Hot Electron Transistor (RHET)", Japanese Journal of Applied Physics, vol. 24, No. 11, Nov., 1985, pp. L853-L854.
T. Futatsugi et al., "A Resonant-Tunnelling Bipolar Transistor (RBT)-A New Functional Device with High Current Gain", Japanese Journal of Applied Physics, vol. 26, No. 2, Feb., 1987, pp. L131-L133.
M. Shur, et al., "New Negative Resistance Regime of Heterostructure Insulated Gate Transistor (HIGFET) Operation", IEEE Electron Device Letters, vol. ED-1-7, No. 2, Feb. 1986, pp. 78-80.

Primary Examiner—Edward P. Westin
Assistant Examiner—Richard Roseen
Attorney, Agent, or Firm—Staas & Halsey

[57] ABSTRACT

A logic circuit includes n input terminals where n is an odd integer, an output terminal, and n input resistance elements respectively connected to the n input terminals. The logic circuit also includes a negative differential conductance element having a negative differential conductance in which the negative differential conductance element outputs a peak voltage and a valley voltage higher than the peak voltage. The negative differential conductance element has a first terminal coupled to the n input terminals via the n input resistance elements, and a second terminal. The negative differential conductance element outputs a first group of voltages lower than the peak voltage to the second terminal when the number of input terminals which are at a low level is greater than the number of input terminals which are at a high level, and outputs a second group of voltages to the second terminal when the number of input terminals which are at the high level is greater than the number of input terminals which are at the low level. Further, the logic circuit includes an output circuit which outputs a first voltage indicating the first group of voltages to the output terminal and which outputs a second voltage indicating the second group of voltages.

13 Claims, 6 Drawing Sheets

LOGIC CIRCUIT USING ELEMENT HAVING NEGATIVE DIFFERENTIAL CONDUCTANCE

BACKGROUND OF THE INVENTION

The present invention generally relates to a logic circuit using an element having a negative differential conductance, such as a resonant-tunneling hot electron transistor (RHET) or a resonant-tunneling bipolar transistor (RBT). More specifically, the present invention is concerned with a majority logic circuit.

A majority logic circuit is used in logic circuits, particularly, adders. An addition operation on two numerals A and B is carried out in a digit unit. The binary values Ai and Bi of the i-th digit and a carry bit Ci-1 propagated from the (i-1)th digit are added. A full adder provided for each digit is composed of a three-input exclusive-OR circuit and a three-input majority logic circuit. The binary values Ai and Bi and the carry bit Ci-1 are input to the three-input exclusive-OR circuit and the three-input majority logic circuit. The three-input exclusive-OR circuit outputs a sum signal S, and the three-input majority logic circuit generates a carry signal Ci on the basis of a majority logic.

The majority logic is as follows. When the number of high-level inputs is greater than that of low-level inputs, the result of the majority logic is a high level. On the other hand, when the number of low-level inputs is greater than that of high-level inputs, the result of the majority logic is a low level. The addition operation on the binary values A, B and C generates a carry of 1 when at least two of the binary values A, B and C are equal to 1, and generates a carry of 0 when only one of the binary values A, B and C is equal to 1 or all of them are zero.

The three-input majority logic employed in the full adder is written as follows:

$$Q = AB + BC + CA$$

where Q is the result of the majority logic. Thus, it is possible to implement the three-input majority logic by three two-input NAND circuits and a single three-input NAND circuit, or by three two-input NOR circuits and a single three-input NOR circuit. It is also known a three-input majority logic circuit formed of ECL circuits (see M. Suzuki et al., "GATE ARRAYS", 1988 IEEE International Solid-State Circuits Conference, ISSCC 88, Wednesday, Feb. 17, 1988, pp. 70-71).

However, the above-mentioned conventional three-input majority logic circuit needs a large number of transistors.

SUMMARY OF THE INVENTION

It is a primary object of the present invention to provide a majority logic circuit by using a reduced number of transistors.

This object of the present invention is achieved by a logic circuit comprising: n input terminals where n is an odd integer; an output terminal; and n input resistance elements respectively connected to the n input terminals. The logic circuit also includes a negative differential conductance element having a negative differential conductance in which the negative differential conductance element outputs a peak voltage and a valley voltage higher than the peak voltage, the negative differential conductance element having a first terminal coupled to the n input terminals via the n input resistance elements, and a second terminal, the negative differential conductance element outputting a first group of voltages lower than the peak voltage to the second terminal when the number of input terminals which are at a low level is greater than the number of input terminals which are at a high level, and outputting a second group of voltages to the second terminal when the number of input terminals which are at the high level is greater than the number of input terminals which are at the low level. Further, the logic circuit includes output circuit means, coupled to the second terminal of the negative differential conductance element means, for outputting a first voltage indicating the first group of voltages to the output terminal and for outputting a second voltage indicating the second group of voltages.

BRIEF DESCRIPTION OF THE DRAWINGS

Other objects, fea and advantages of the present invention will become more apparent from the following detailed description when read in conjunction with the accompanying drawings, in which.

DESCRIPTION OF THE PREFERRED EMBODIMENTS

Figure 1:
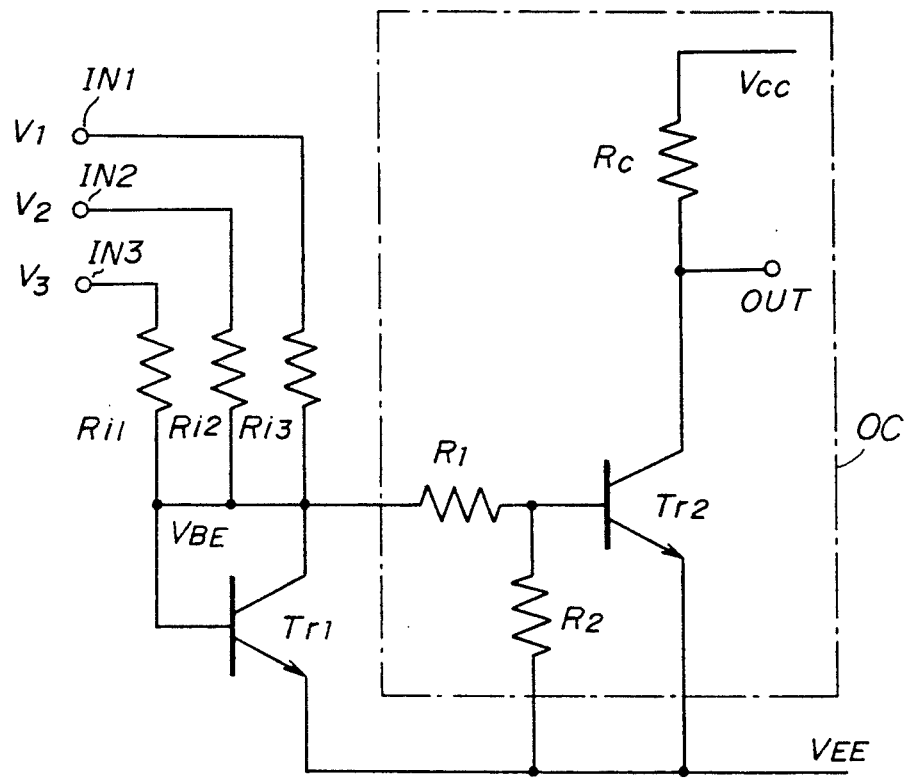
FIG. 1 is a circuit diagram of a three-input majority logic circuit according to a preferred embodiment of the present invention.

Referring to FIG. 1, a three-input majority logic circuit is composed of a transistor Tr1, three input resistors Ri1, Ri2 and Ri3, and an output circuit OC. The transistor Tr1 has a negative differential conductance, and is formed of an RHET in this embodiment. An RHET is disclosed in, for example, N. Yokoyama et al., "A NEW FUNCTIONAL, RESONANT-TUNNELING HOT ELECTRON TRANSISTOR (RHET)", Japanese Journal of Applied Physics, Vol. 24, No. 11, Nov., 1985, pp. L853-L854. The collector of the transistor Tr1 is connected to the base thereof so that the transistor Tr1 is diode-connected. The input resistor Ri3 is connected between an input terminal IN1 and the collector and base of the transistor Tr1. The input resistor Ri2 is connected between an input terminal IN2 and the collector and base of the transistor Tr1. The input resistor Ri3 is connected between an input terminal IN3 and the collector and base of the transistor Tr1. The emitter of the transistor Tr1 is connected to a low-potential side power source $V_{EE}$.

The output circuit OC is composed of a transistor Tr2, and voltage dividing resistors R1 and R2, and a load resistor Rc. The resistor R1 is connected between the collector of the transistor Tr1 and the base of the transistor Tr2. The resistor R2 is connected between the base of the transistor Tr2 and the power source $V_{EE}$. An output potential obtained at the collector of the transistor Tr1 is divided by the combination of the resistors R1 and R2. The collector of the transistor Tr2 is connected to an output terminal OUT, and coupled to a high-potential side power source $V_{CC}$ via the load resistor Rc. The transistor Tr2 may have a negative differential conductance or a positive differential conductance.

Figure 2:
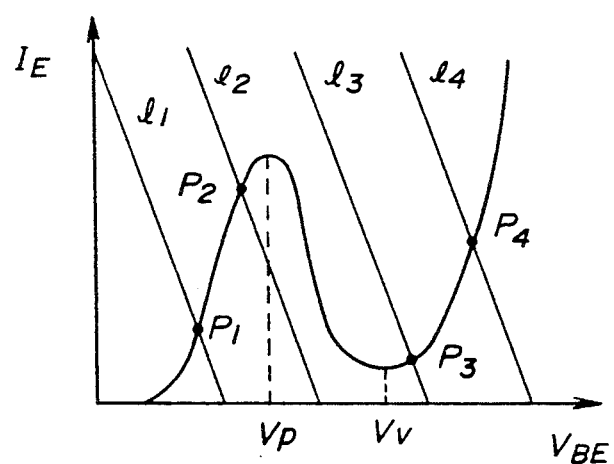
FIG. 2 is a graph illustrating the operation of a transistor having a negative differential conductance shown in FIG. 1.

FIG. 2 is a graph illustrating the relationship between an emitter current $I_E$ and base-emitter voltage $V_{BE}$ of the diode-connected transistor Tr1. A curve showing this relationship has a substantially N shape. When the base-emitter voltage $V_{BE}$ is within a certain voltage range, the emitter current $I_E$ decreases as the base-emitter voltage $V_{BE}$ increases. This phenomenon is based on a resonant-tunneling current passing from the base of the transistor Tr1 to the emitter thereof. Load lines $l_1$, $l_2$, $l_3$ and $l_4$ are drawn on the graph of the $I_E$-$V_{BE}$ characteristic. The load lines $l_1$, $l_2$, $l_3$ and $l_4$ are determined based on input voltages V1, V2 and V3 of the input terminals IN1, IN2 and IN3, the input resistors Ri1, Ri2 and Ri3, and the voltage dividing resistors R1 and R2. Cross points P1, P2, P3 and P4 where the load lines $l_1$, $l_2$, $l_3$ and $l_4$ cross the $I_E$ curve correspond to operating points of the transistor Tr1. The emitter current $I_E$ obtained when the transistor Tr1 operates at the operating points P1 or P3 is less than that obtained when the transistor Tr1 operates at the operating points P2 or P4.

The input voltages V1, V2 and V3 are output signals of circuits of the previous stages, and swing between a high level and a low level. The high levels of the voltages V1, V2 and V3 are identical to each other, the low levels thereof are also identical to each other. The resistance values of the input resistors Ri1, Ri2 and Ri3 are equal to each other, for example. It is now assumed that the resistance value of each of the resistors Ri1, Ri2 and Ri3 is equal to a resistance value Ri. The base-emitter voltage $V_{BE}$ is equal to a voltage obtained by dividing the average value of the input voltages V1, V2 and V3 by the ratio of Ri/3 and (R1+R2). When the emitter current $I_E$ passing through the transistor Tr1 passes through the resistors Ri1, Ri2 and Ri3, the base-emitter voltage $V_{BE}$ obtained by the voltage dividing operation decreases. Thus, the load lines $l_1$, $l_2$, $l_3$ and $l_4$ are inclined, as shown in FIG. 2. As the resistance values of the resistors Ri1, Ri2 and Ri3 decreases, the slopes of the load lines lhd 1, 2, $l_3$ and $l_4$ increase. On the other hand, the slopes of the load lines $l_1$, $l_2$, $l_3$ and $l_4$ decrease as the resistance values of the resistors Ri1, Ri2 and Ri3 increases.

The resistance values of the resistors Ri1, Ri2, Ri3, R1 and R2 are selected so that the following operation is realized. When all the voltages V1, V2 and V3 are at the low level, the transistor Tr1 operates at the operating point P1. When any one of the voltages V1, V2 and V3 is at the high level, the transistor Tr1 operates at the operating point P2. When two of the voltages V1, V2 and V3 are at the high level, the transistor Tr1 operates at the operating point P3. When all the voltages V1, V2 and V3 are at the high level, the transistor Tr1 operates at the operating point P4. The base-emitter voltages $V_{BE}$ obtained at the operating points P1 and P2 are lower than a peak base-emitter voltage Vp corresponding to a peak of the $I_E$ curve. The base-emitter voltages obtained at the operating points P3 and P4 are higher than a valley base-emitter voltage Vv corresponding to a valley of the $I_E$ curve. Further, the threshold value of the transistor Tr2 is selected so that the transistor Tr2 is OFF when the transistor Tr1 operates at the operating points P1 or P2, and ON when the transistor Tr2 operates at the operating points P3 or P4.

When the transistor Tr2 is ON, the collector current passes through the resistor Rc and the transistor Tr2, so that the potential of the output terminal OUT is a low level. On the other hand, when the transistor Tr2 is OFF, no current passes through the transistor Tr2. Thus, the potential of the output terminal Tr2 is approximately equal to the power source voltage $V_{CC}$. Thus, the circuit shown in FIG. 1 generates the high-level output signal when the number of inputs which are at the high level is equal to or less than 1, and generates the low-level output signal when the number of inputs which are at the high level is equal to or greater than 2. Thus, the circuit shown in FIG. 1 corresponds to a circuit obtained by adding a NOT circuit to the output side of the majority logic circuit. A majority logic circuit is obtained by inverting the output signal at the output terminal OUT by an inverter (NOT) circuit.

Figure 3B:
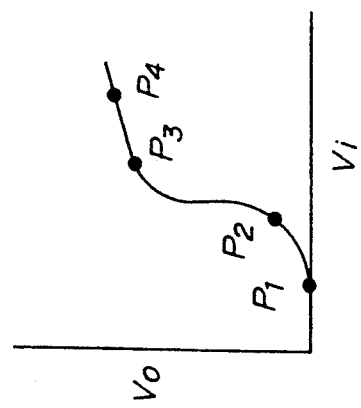
FIGS. 3A and 3B are diagrams illustrating the operation of a transistor shown in FIG. 1 which carries out a majority logic.
Figure 3A:
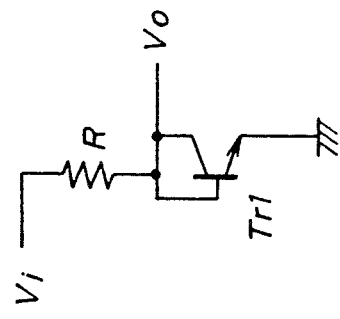

A further description will now be given of the circuit shown in FIG. 1. Referring to FIG. 3A, there is illustrated a simplified circuit of the transistor Tr1 and the resistors Ri1, Ri2 and Ri3. An input voltage Vi is applied to the collector and base of the transistor Tr1 via an input resistor R, and an output voltage Vo is obtained at the collector thereof. FIG. 3B is a graph showing the relationship between the input voltage Vi and the output voltage Vo. Since the transistor Tr1 has the negative differential conductance, the output voltage Vo derived from the transistor Tr1 changes from low voltages to high voltages within a narrow range defined by the load lines $l_2$ and $l_3$. The input voltage Vi corresponds to $[(V1+V2+V3)/3] \times [(R1+R2)/((Ri/3)+R1+R2)]$ in the circuit shown in FIG. 1.

That is, the three-input majority circuit is realized by the transistor Tr1 and the resistors Ri1, Ri2, Ri3, R1 and R2. The output circuit OC is provided for obtaining an amplitude of the output signal of the three-input majority circuit sufficient to drive a circuit of the following stage. The output circuit 0C shown in FIG. 1 utilizes the threshold characteristic of the transistor Tr2. That is, the transistor Tr2 is OFF when the transistor Tr1 operates at the operating points P1 or P2, and ON when the transistor Tr1 operates at the operating points P3 or P4. It can be seen from the graph of FIG. 3B, there is a great difference between the low-level of the output voltage Vo and the high-level thereof. Thus, the transistor Tr2 is not required to have a sharp threshold characteristic.

It should be noted that if a transistor which does not have a negative differential conductance is used in place of the transistor Tr1, it is impossible to obtain a threshold characteristic as shown in FIG. 3B.

For example, the resistance values of the resistors used in the circuit shown in FIG. 1 are so that Ri=800 ohms, R1=300 ohms, R2=1000 ohms, and Rc=2000 ohms. When the emitter sizes of the transistors Tr1 and Tr2 are respectively $2\mu m \times 5\mu m$ and $2\mu m \times 20\mu m$, $V_{CC}$=2.5V and $V_{EE}$=OV, the collector currents passing through the transistors Tr1 and Tr2 are respectively equal to 1mA and 4mA. The base-emitter voltage $V_{BE}$ obtained at the operating point P1 is approximately equal to 0.3V, the base-emitter voltage $V_{BE}$ obtained at the operating point P2 is approximately equal to 0.6V, and the base-emitter voltage $V_{BE}$ obtained at the operating point P3 is approximately equal to 1.0V.

Figure 4:
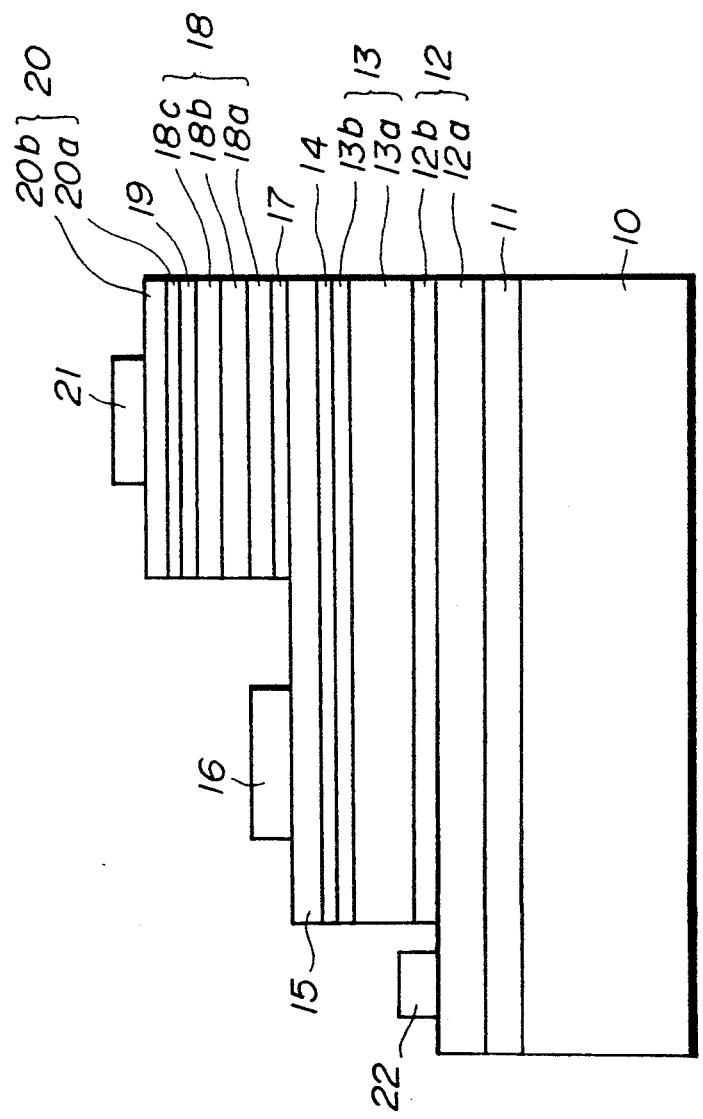
FIG. 4 is a cross-sectional view of the transistor shown in FIG. 1 which carries out the majority logic.

FIG. 4 is a cross-sectional view of an RHET forming the transistor Tr1. The RHET shown in FIG. 4 is composed of a substrate 10, a buffer layer 11, a collector layer 12 consisting of two layers 12a and 12b, a collector barrier layer 13 consisting of two layers 13a and 13b, a spacer layer 14 and a base layer 15. A base electrode 16 is formed on the base layer 15. Further, on the base layer 15, there are provided a spacer layer 17, a resonance barrier layer 18 consisting of three layers 18a, 18b and 18c, a spacer layer 19 and an emitter layer 20 consisting of two layers 20a and 20b. An emitter electrode 21 is formed on the emitter layer 20, and a collector electrode 22 is formed on the layer 12a. The device condition of the RHET shown in FIG. 5 is shown in Table 1.

TABLE 1

| Layer | Material | Impurity dose | Thickness |
|---|---|---|---|
| 10 | SI InP | | |
| 11 | i-In$_{0.52}$Al$_{0.48}$As | | 200 nm |
| 12: 12a | n-In$_{0.53}$Ga$_{0.47}$As | $5 \times 10^{18}$ cm$^{-3}$ | 300 nm |
| 12b | n-In$_{0.53}$Ga$_{0.47}$As | $1 \times 10^{18}$ cm$^{-3}$ | 100 nm |
| 13: 13a | i-In$_{0.53}$Ga$_{0.47}$As | | 300 nm |
| 13b | i-(In$_{0.53}$Ga$_{0.47}$)$_{0.5}$(In$_{0.52}$Al$_{0.48}$)$_{0.5}$As | | 50 nm |
| 14 | i-In$_{0.53}$Ga$_{0.47}$As | | 1.5 nm |
| 15 | n-In$_{0.53}$Ga$_{0.47}$As | $1 \times 10^{18}$ cm$^{-3}$ | 27 nm |
| 17 | i-In$_{0.53}$Ga$_{0.47}$As | | 1.5 nm |
| 18: 18a | i-AlAs | | 2.37 nm |
| 18b | n-In$_{0.53}$Ga$_{0.47}$As | | 2.93 nm |
| 18c | i-In$_{0.52}$Al$_{0.48}$As | | 6.45 nm |
| 19 | i-In$_{0.53}$Ga$_{0.47}$As | | 1.5 nm |
| 20: 20a | n-In$_{0.53}$Ga$_{0.47}$As | $1 \times 10^{18}$ cm$^{-3}$ | 50 nm |
| 20b | n-In$_{0.53}$Ga$_{0.47}$As | $5 \times 10^{19}$ cm$^{-3}$ | 150 nm |

Figure 5:
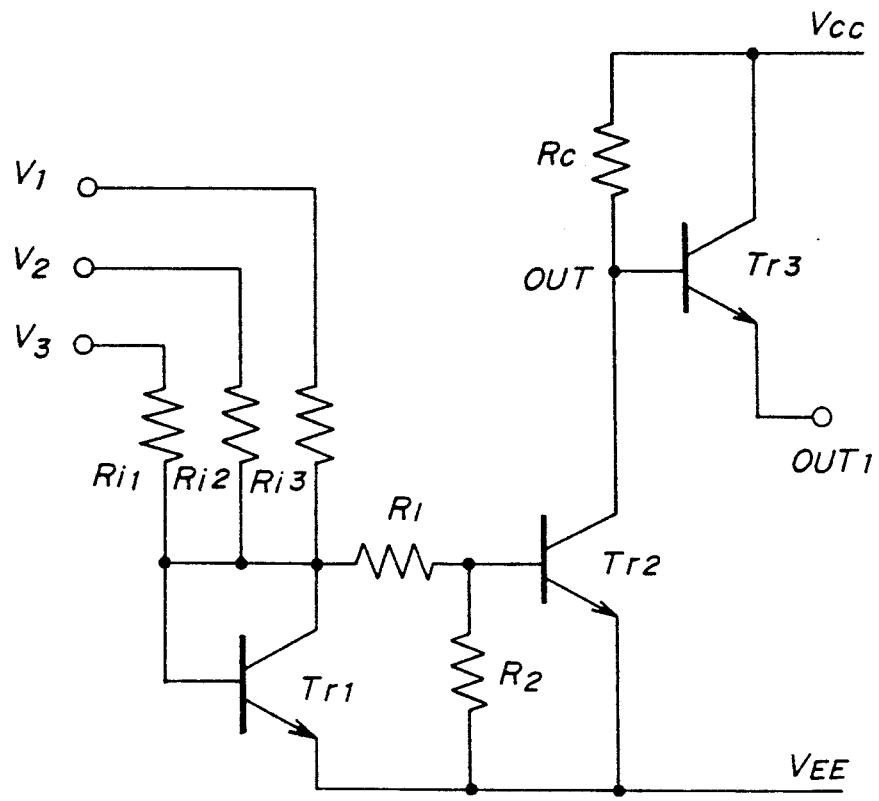
FIG. 5 is a circuit diagram of a variation of the circuit shown in FIG. 1.

FIG. 5 is a circuit diagram of a variation of a variation of the circuit shown in FIG. 1. In FIG. 5, those parts which are the same as those shown in FIG. 1 are given the same reference numerals. An emitter follower transistor Tr3 is coupled to the collector of the transistor Tr2. More specifically, the base of the emitter follower transistor is connected to the collector of the transistor Tr2. The resistor Rc is connected between the collector and base of the transistor Tr3. The emitter of the transistor Tr3 is connected to an output terminal OUT1. A high level of the output signal at the output terminal OUT1 is equal to or higher than 1.6V, and a low level thereof is equal to or lower than 0.8V. Of course, it is possible to drivability sufficient to drive a circuit of the next stage. The peak currents of the transistors Tr2 and Tr3 are approximately 4mA, that is, four times as much as that of the transistor Tr1.

Figure 6:
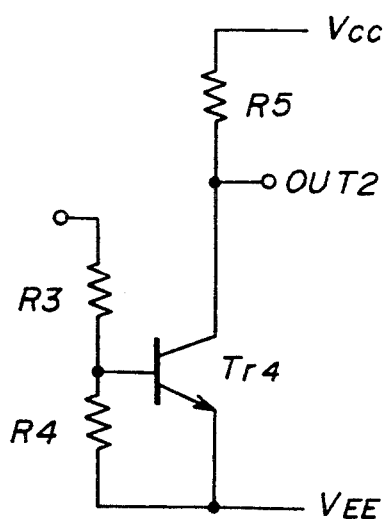
FIG. 6 is a circuit diagram of an inverter (NOT) circuit added to the circuit shown in FIG. 1.

As has been described previously, the circuit shown in FIG. 1 outputs the inverted version of the result of the majority logic. As shown in FIG. 6, the result of the majority logic is obtained by adding an inverter circuit to the circuit shown in FIG. 1. The inverter circuit shown in FIG. 6 is composed of a transistor Tr4 and resistors R3, R4 and R5. The base of the transistor Tr4 shown in FIG. 1 is connected to the output terminal OUT via the resistor R3, and connected to the power source $V_{EE}$ via the resistor R4. The emitter of the transistor Tr4 is directly connected to the power source $V_{EE}$. The resistor R5 is connected to the collector of the transistor Tr4 and the power source $V_{CC}$. The collector of the transistor Tr4 functions as an output terminal OUT2 of the majority circuit. For example, R3=2000 ohms, R4=4000 ohms, and R5=1500 ohms. $V_{CC}$=2.5V and $V_{EE}$ is 0V. When the emitter size of the transistor Tr4 is 2μm×20μm, the peak collector current of the transistor Tr4 is approximately equal to 4mA.

When all of the input voltages V1, V2 and V3 are low or two of them are low, a low-level output signal is obtained at the output terminal OUT2. On the other hand, when one of the input terminals V1, V2 and V3 is low or all of them are high, a high-level output signal is obtained at the output terminal OUT2. It is preferable that the transistor Tr4 be formed of a transistor having the same type as the transistors Tr1 and Tr2 from the point of view of the production process.

It is possible to employ an RBT having a negative differential conductance in place of the RHET. An RBT is disclosed in, for example, T. Futatsugi, et al., "A RESONANT-TUNNELING BIPOLAR TRANSISTOR (RBT)—A NEW FUNCTIONAL DEVICE WITH HIGH CURRENT GAIN", Japanese Journal of Applied Physics, Vo. 26, NO. 2, Feb., 1987, pp. L131-133.

Figure 7:
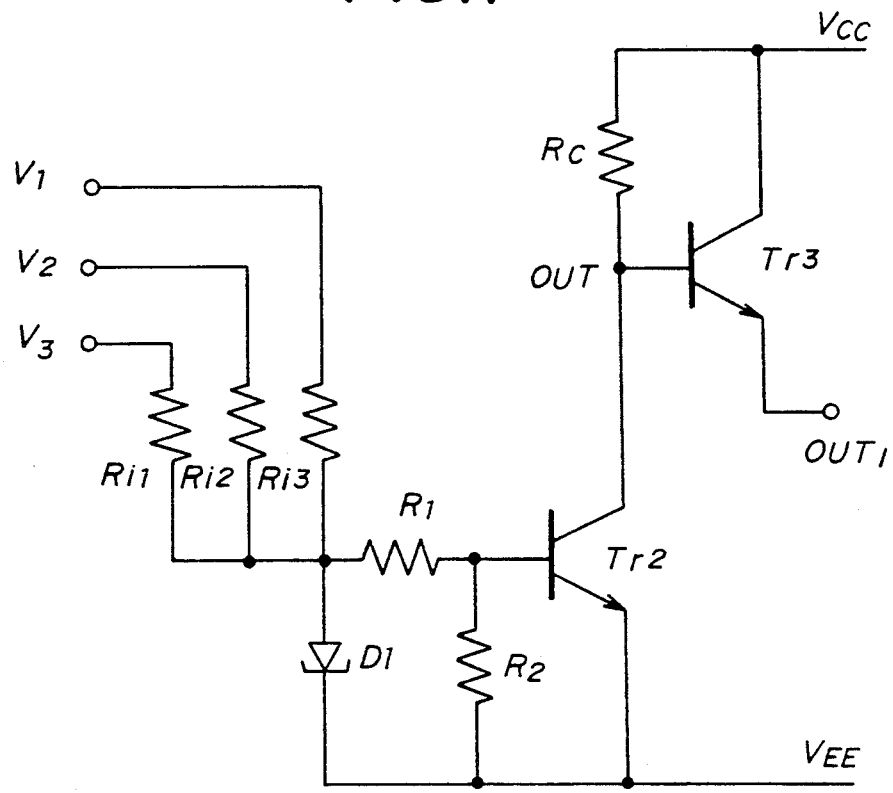
FIG. 7 is a circuit diagram of another embodiment of the present invention.

As shown in FIG. 7, it is also possible to use a resonant-tunneling diode D1 having a negative differential conductance in place of the transistor Tr1 shown in FIG. 1, since the transistor Tr1 functions as a two-terminal active element. The anode terminal of the diode D1 is connected to the resistors Ri1, Ri2 and Ri3, and the cathode terminal thereof is connected to the power source $V_{EE}$. It is possible to omit the emitter follower transistor Tr3, if the transistor Tr2 has a drivability to drive a circuit of the next stage.

Figure 8:
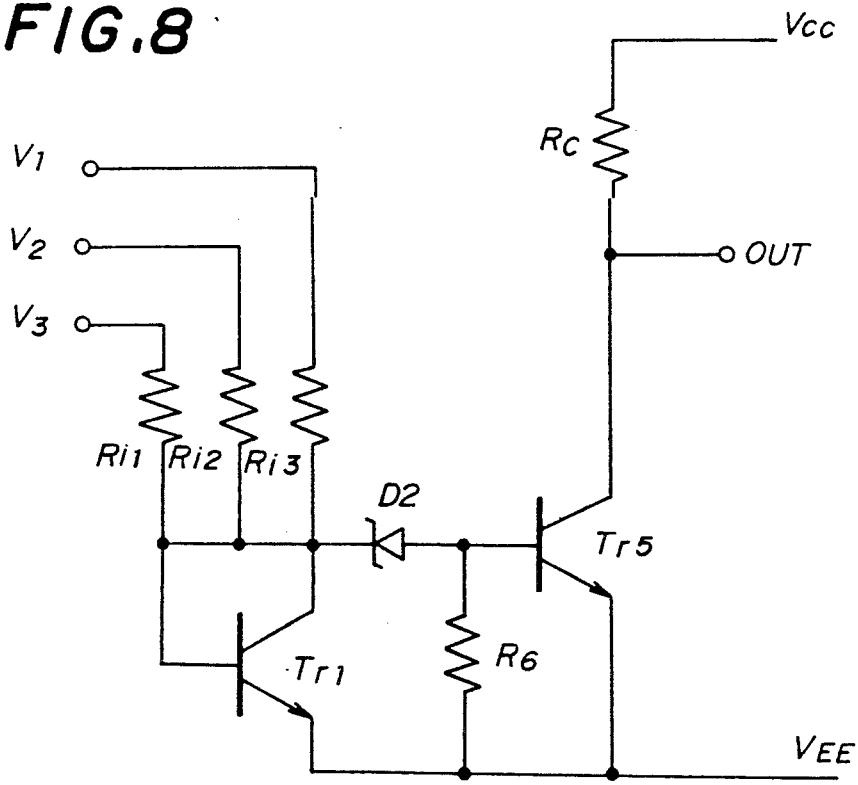
FIG. 8 is a circuit diagram of yet another embodiment of the present invention.

As shown in FIG. 8, the combination of a Zener diode D2 and a resistor R6 is substituted for the output circuit OC shown in FIG. 1. The cathode terminal of the Zener diode D2 is connected to the collector of the transistor Tr1, and the anode terminal thereof is connected to the base of a transistor Tr5 and the resistor R6. As has been described previously, the output circuit OC functions to determine the base-emitter voltage $V_{BE}$ of the transistor Tr1 on the basis of the threshold voltage of the transistor Tr2. The base-emitter voltage $V_{BE}$ of the transistor Tr1 can be detected in the form of a voltage drop developed across the resistor R6. The transistor Tr5 functions to amplify this voltage drop.

Figure 9A:
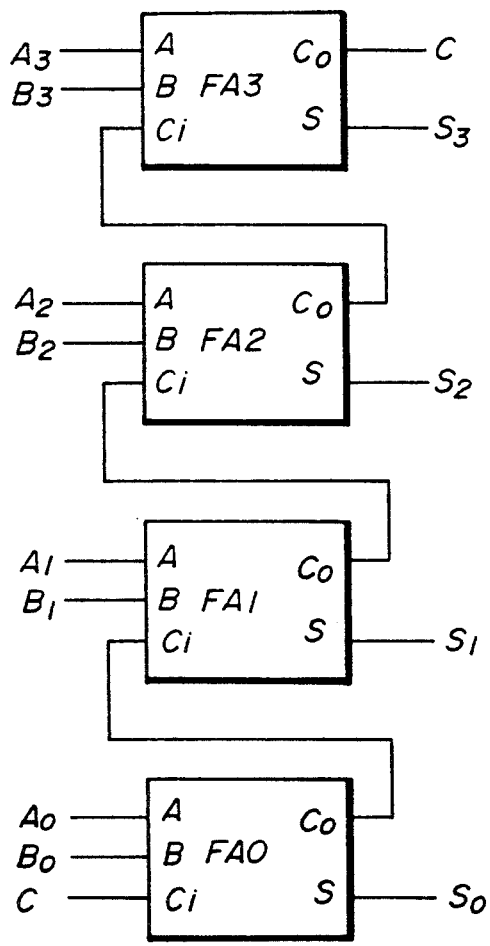
FIGS. 9A and 9B are diagrams showing a four-bit full adder which uses the three-input majority circuit according to the present invention.
Figure 9B:
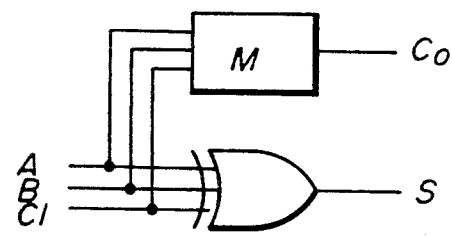

FIG. 9A is a block diagram of a four-bit full adder, which has four full adders FA0, FA1, FA2 and FA3. Two input signals Ai and Bi (i=0, 1, 2, 3) are input to the respective adders FAi. A carry bit C is input to the adder FA0, which outputs a sum signal S0 and a carry signal C0. The carry signal C0 is input to the adder FA1. In this way, the carry signal is propagated to the next-digit adder.

As shown in FIG. 7B, each of the adders FA0–FA3 is composed of a three-input exclusive NOR circuit (E-XOR) and a majority logic circuit (M). The three-input exclusive NOR circuit is formed of a conventional circuit disclosed in, for example, M. Suzuki et al., "GATE ARRAYS", 1988 IEEE International Solid-State Circuits Conference, ISSCC 88, Wednesday, Feb. 17, 1988, pp. 70-71. The majority logic circuit M is formed according to the present invention.

It is possible to provide a five-input majority logic circuit in view of the principle of the present invention. In this case, two input resistors are added and two load lines are drawn so as to be separated from each other by the peak or valley of the $I_E$ curve shown in FIG. 2.

It is also possible to simply replace the RHET used in the aforementioned embodiments by an RBT disclosed in Japanese Laid-Open Patent Application No. 60-270803 (which corresponds to U.S. Pat. application Ser. No. 293,586 filed on Jan. 4, 1989). It is also possible to use a real space transfer device disclosed in, for example, Michael S. Shur et al., "New Negative Resistance Regime of Heterostructure Insulated Gate Transistor (HIGFET) Operation", IEEE Electron Device Lett. vol. EDL-17, p78, 1986. The two-terminal element is also formed of an Esaki diode disclosed in L. Esaki, "New Phenomenon in Narrow Germanium p-n Junctions", Phys. Rev. 109, p603, 1958, or a resonant-tunneling diode disclosed in L.L. Chang, et al., "Appl. Phys. Lett. 24, p593, 1974. The diode D1 shown in FIG. 7 is replaced by the two-terminal element.

The present invention is not limited to the specifically disclosed embodiments, and variations and modifications may be made without departing from the scope of the present invention.

What is claimed is:

1. A logic circuit comprising:
   n input terminals where n is an odd integer;
   an output terminal;
   n input resistance elements respectively connected to said n input terminals;
   a negative differential conductance element having a negative differential conductance in which said negative differential conductance element outputs a peak voltage and a valley voltage lower than said peak voltage, said negative differential conductance element having a first terminal coupled to said n input terminals via said n input resistance elements, and a second terminal, said negative differential conductance outputting a first group of voltages lower than said peak voltage to said second terminal when the ny umber of input terminals which are at a low level is greater than the number of input terminals which are at a high level, and outputting a second group of voltages to said second terminal when the number of input terminals which are at the high level is greater than the number of input terminals which are at the low level, said negative differential conductance element comprising:
      a transistor having a negative differential conductance and having a base coupled to said n input terminals via said n input resistance elements and serving as said first terminal, a collector connected to said base and serving as said second terminal, and an emitter set to a reference voltage; and
   output circuit means, coupled to the second terminal of said negative differential conductance element, for outputting a first voltage indicating said first group of voltages to said output terminal and or outputting a second voltage indicating said second group of voltages, said output circuit means comprising:
      a load resistance element; and
      a transistor having a base operatively connected to said second terminal of said negative differential conductance element, and a collector connected to said output terminal and to a first power source via said load resistance element, and an emitter connected to a second power source.

2. A logic circuit as claimed in claim 1, wherein said negative differential conductance transistor has a first group of base-emitter voltages which corresponds to said first group of voltages and which are lower than said peak voltage at which a peak emitter current passes through said transistor, and s second group of base-emitter voltages which corresponds to said second group of voltages and which are higher than said valley voltage at which a valley emitter current passes through said transistor.

3. A logic circuit as claimed in claim 1, wherein said output circuit means further comprises:
   voltage divider means for dividing a voltage of said second terminal and for outputting a divided voltage.

4. A logic circuit as claimed in claim 3, wherein:
   said voltage divider means comprises first and second divider resistance elements connected in series between said second terminal and said second power source; and
   a node at which said first and second divider resistance elements are connected in series is connected to the base of said output circuit transistor.

5. A logic circuit as claimed in claim 1, wherein said negative differential conductance element comprises a first transistor having a negative differential conductance and having a base coupled to said n input terminal via said n input resistance elements and serving as said first terminal, a collector connected to said base and serving as said second terminal, and an emitter, and
   wherein said output circuit mans comprises:
      voltage divider means or dividing a voltage of said second terminal and or outputting a divided voltage;
      a load resistance element; and
      a second transistor having a base to which said divided voltage is applied, and a collector connected to said output terminal and to a first power source via said load resistance element, and an emitter connected to a second power source to which the emitter of said first transistor is also connected.

6. A logic circuit as claimed din claim 5, wherein:
   said voltage divider means comprises first and second divider resistance elements connected in series between said second terminal and said second power source; and
   a node at which said first and second divider resistance element are connected in series is connected to the base of said second transistor.

7. A logic circuit as claimed in claim 6, wherein resistance values of said n input resistance elements and said first and second divider resistance elements are selected so that said negative differential conductance element outputs the first group of voltages lower than said peak voltage to said second terminal when the number of input terminals which are at the low level is greater than the number of input terminals which are at the high level, and outputs the second group of voltages to said second terminal when the number of input terminals which are at the high level is greater than the number of input terminals which are at the low level.

8. A logic circuit as claimed in claim 1, wherein said output circuit means further comprises an emitter follower transistor having a base connected to said output terminal, the collector connected to a predetermined power source, and an emitter coupled to another output terminal.

9. A logic circuit as claimed in claim 1, further comprising inverter means, coupled to said output terminal, for inverting said first voltage and said second voltage.

10. A logic circuit as claimed in claim 1, wherein said negative differential conductance element comprises a resonant-tunneling hot electron transistor.

11. A logic circuit as claimed in claim 1, wherein said negative differential conductance element comprises a resonant-tunneling bipolar transistor.

12. A logic circuit as claimed in claim 1, wherein said negative differential conductance element comprises a resonant-tunneling diode.

13. A logic circuit as claimed in claim 1, wherein said output circuit comprises:
- a Zener diode having a cathode terminal connected to said second terminal, and an anode terminal; and
- a resistor having a first end connected to the anode terminal of said Zener diode, and a second terminal tow which a reference voltage is applied, and wherein said anode terminal of said Zener diode is connected to the first end of said resistor at a node.

* * * * *

UNITED STATES PATENT AND TRADEMARK OFFICE
CERTIFICATE OF CORRECTION

PATENT NO. : 5,153,461
DATED : October 6, 1992
INVENTOR(S) : Motomu Takatsu

It is certified that error appears in the above-identified patent and that said Letters Patent is hereby corrected as shown below:

On the Title page, item

[56] References Cited, second column, line 5, "ED-"

should be --EDL-7--; and line 6, "1-7" should be deleted.

Col. 2, line 19, "fea" should be --features--.

Col. 3, line 54, "1hd 1,₂" should be --$l_1$, $l_2$--.

Col. 4, line 48, "OC" should be --OC--.

Col. 6, line 23, "Vo." should be --Vol.--.

Col. 7, line 39, "ny umber" should be --number--.

Col. 8, line 6, after and, "s" should be --a--;

line 27, "terminal" should be --terminals--;

line 31, "mans" should be --means--;

line 43, "din" should be --in--; and line 49, "element" should be --elements--.

UNITED STATES PATENT AND TRADEMARK OFFICE
CERTIFICATE OF CORRECTION

PATENT NO. : 5,153,461
DATED : October 6, 1992
INVENTOR(S) : Motomu Takatsu

It is certified that error appears in the above-indentified patent and that said Letters Patent is hereby corrected as shown below:

Col. 10, line 10, "tow which" should be --to which--.

Signed and Sealed this

Twenty-second Day of February, 1994

BRUCE LEHMAN

*Attest:*

*Attesting Officer*    *Commissioner of Patents and Trademarks*